United States Patent
Briggs et al.

(10) Patent No.: US 9,905,459 B1
(45) Date of Patent: Feb. 27, 2018

(54) NEUTRAL ATOM BEAM NITRIDATION FOR COPPER INTERCONNECT

(71) Applicant: INTERNATIONAL BUSINESS MACHINES CORPORATION, Armonk, NY (US)

(72) Inventors: Benjamin D. Briggs, Waterford, NY (US); Lawrence A. Clevenger, LaGrangeville, NY (US); Michael Rizzolo, Albany, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/254,333

(22) Filed: Sep. 1, 2016

(51) Int. Cl.
*H01L 21/76* (2006.01)
*H01L 21/768* (2006.01)
*H01L 23/532* (2006.01)

(52) U.S. Cl.
CPC .. *H01L 21/76847* (2013.01); *H01L 21/76826* (2013.01); *H01L 23/53238* (2013.01)

(58) Field of Classification Search
CPC ......... H01L 21/76801; H01L 21/76802; H01L 21/76822; H01L 21/76826; H01L 21/76841; H01L 21/76843; H01L 21/76847; H01L 23/53238; H05H 3/00; H05H 3/02; H05H 3/04; H05H 3/06; C23C 14/02; C23C 14/022; C23C 14/024; C23C 14/028; C23C 14/14; C23C 16/0263; C23C 16/06; C23C 16/18; C23C 18/04

See application file for complete search history.

(56) References Cited

U.S. PATENT DOCUMENTS

| | | | |
|---|---|---|---|
| 6,191,023 B1 | 2/2001 | Chen | |
| 6,242,349 B1 | 6/2001 | Nogami et al. | |
| 6,294,458 B1 | 9/2001 | Lhang et al. | |
| 6,342,448 B1 | 1/2002 | Lin et al. | |
| 6,399,445 B1* | 6/2002 | Hattangady | H01L 21/28185 257/411 |
| 6,642,619 B1* | 11/2003 | Ngo | H01L 21/02131 257/750 |
| 6,667,231 B1 | 12/2003 | Wu | |

(Continued)

FOREIGN PATENT DOCUMENTS

| | | |
|---|---|---|
| JP | 2003086922 A | 3/2003 |
| JP | 2005347438 A | 12/2005 |

(Continued)

*Primary Examiner* — Scott B Geyer
(74) *Attorney, Agent, or Firm* — Tutunjian & Bitetto, P.C.; Vazken Alexanian (57) ABSTRACT

A method of forming an interconnect that in one embodiment includes forming an opening in a dielectric layer, and treating a dielectric surface of the opening in the dielectric layer with a nitridation treatment to convert the dielectric surface to a nitrided surface. The method may further include depositing a tantalum containing layer on the nitrided surface. In some embodiments, the method further includes depositing a metal fill material on the tantalum containing layer. The interconnect formed may include a nitrided dielectric surface, a tantalum and nitrogen alloyed interface that is present on the nitrided dielectric surface, a tantalum layer on the tantalum and nitrogen alloy interface, and a copper fill.

14 Claims, 5 Drawing Sheets

(56) References Cited

U.S. PATENT DOCUMENTS

| | | | |
|---|---|---|---|
| 6,680,538 B2 | 1/2004 | Kim et al. | |
| 6,909,188 B2 | 6/2005 | Akiyama | |
| 6,919,636 B1* | 7/2005 | Ryan | H01L 21/76807 |
| | | | 257/751 |
| 6,921,722 B2* | 7/2005 | Ogure | C23C 16/18 |
| | | | 216/65 |
| 6,952,052 B1 | 10/2005 | Marathe | H01L 21/76846 |
| | | | 257/750 |
| 7,968,422 B2* | 6/2011 | Hautala | H01L 21/0214 |
| | | | 257/E21.546 |
| 8,420,531 B2 | 4/2013 | Yang et al. | |
| 9,761,484 B1* | 9/2017 | Yang | H01L 21/76868 |
| 2001/0021539 A1* | 9/2001 | Akane | H01L 21/318 |
| | | | 438/46 |
| 2001/0054558 A1* | 12/2001 | Tada | C25D 7/12 |
| | | | 205/123 |
| 2001/0055649 A1* | 12/2001 | Ogure | C23C 16/18 |
| | | | 427/248.1 |
| 2003/0218256 A1* | 11/2003 | Merchant | H01L 21/76807 |
| | | | 257/774 |
| 2004/0108470 A1* | 6/2004 | Ichiki | H01J 37/3178 |
| | | | 250/492.21 |
| 2006/0141780 A1* | 6/2006 | Cadien | H01L 21/76843 |
| | | | 438/656 |
| 2010/0099251 A1* | 4/2010 | Fu | H01L 21/76814 |
| | | | 438/653 |
| 2011/0308461 A1* | 12/2011 | Walton | C23C 8/36 |
| | | | 118/723 FE |
| 2012/0235295 A1* | 9/2012 | Ahn | H01L 21/2855 |
| | | | 257/734 |
| 2013/0168863 A1* | 7/2013 | Yang | H01L 21/3105 |
| | | | 257/751 |
| 2013/0217225 A1* | 8/2013 | Hayakawa | H01L 21/288 |
| | | | 438/643 |
| 2016/0181149 A1* | 6/2016 | Deng | H01L 21/76826 |
| | | | 257/774 |
| 2016/0204059 A1* | 7/2016 | Fukuo | H01L 21/76802 |
| | | | 257/751 |

FOREIGN PATENT DOCUMENTS

| | | |
|---|---|---|
| JP | 4494873 B2 | 6/2010 |
| JP | 2014236090 A | 12/2014 |
| JP | 2015131421 A | 7/2015 |
| JP | 5861016 B1 | 2/2016 |

* cited by examiner

NEUTRAL ATOM BEAM NITRIDATION FOR COPPER INTERCONNECT

BACKGROUND

The present disclosure relates to contact structures and structures for transmitting electrical current.

DESCRIPTION OF THE RELATED ART

Modern integrated circuits are made up of literally millions of active devices such as transistors and capacitors. These devices are initially isolated from one another but are later interconnected together to formed functional circuits. The quality of the interconnection structure drastically affects the performance and reliability of the fabricated circuit. Interconnects and contacts are typically formed to bring and transmit electrical signals to semiconductor devices.

SUMMARY

In one aspect, a method of forming an interconnect is described herein. In one embodiment, the method of forming the interconnect includes forming an opening in a dielectric layer; and treating a dielectric surface of the opening in the dielectric layer with a nitridation treatment to convert the dielectric surface to a nitrided surface. In a following step, a tantalum containing layer is deposited on the nitrided surface, and a metal fill material is deposited on the tantalum containing layer.

In another embodiment, the method of forming the interconnect may include forming an opening in a dielectric layer, and treating a dielectric surface of the opening in the dielectric layer with a nitridation treatment to convert the dielectric surface to a nitrided surface. In a following process step, the method continues with depositing a tantalum containing layer on the nitrided surface, and depositing metal fill material on the tantalum containing layer. The interconnect formed by the method may include a nitrided dielectric surface, a tantalum and nitrogen alloy layer that is present on the nitrided dielectric surface, a tantalum layer on a surface of the tantalum and nitrogen alloy layer, and a copper fill.

In another aspect, an interconnect structure is provided that includes a stack composed of a nitrided dielectric surface, and an alloyed interface with the dielectric surface of tantalum and nitrogen. In one embodiment, the interconnect structure includes an opening through a dielectric layer including silicon (Si) and carbon (C), and a nitrided dielectric surface. A tantalum and nitrogen alloy layer interface that is present on the nitrided dielectric surface, and a tantalum layer is present on the tantalum and nitrogen alloy layer surface interface. The interconnect further includes a metal fill that is present on the tantalum layer.

BRIEF DESCRIPTION OF THE SEVERAL VIEWS OF THE DRAWINGS

The following description will provide details of some of the preferred embodiments with reference to the following figures wherein.

DETAILED DESCRIPTION

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

Tantalum nitride (TaN) has been used in semiconductor manufacturing, because it typically adheres well with various insulators and dielectrics, such as those used in interconnect structures and microelectronics. However, it has been determined that the resistance of tantalum nitride (TaN) is relatively high. In some embodiments, the methods and structures that are described herein replace tantalum nitride (TaN) with tantalum (Ta), i.e., tantalum metal, in a liner stack that can be employed in interconnect structure for reducing via resistance. In some embodiments, prior to forming the tantalum (Ta), the patterned dielectric surface is treated to nitridize the patterned dielectric surface before depositing the tantalum (TaN). The nitridation can be employed to maintain the structure integrity and adhesion strength for the tantalum (Ta) being later deposited. The nitridation process is typically selected to avoid dielectric damage. In some embodiments, the nitridation process can include a neutral atom beam treatment. The methods and structures for some embodiments of the copper interconnects that have been treated using neutral atom beam nitridation are now described with greater detail referring to FIGS. 1-8.

Figure 1:
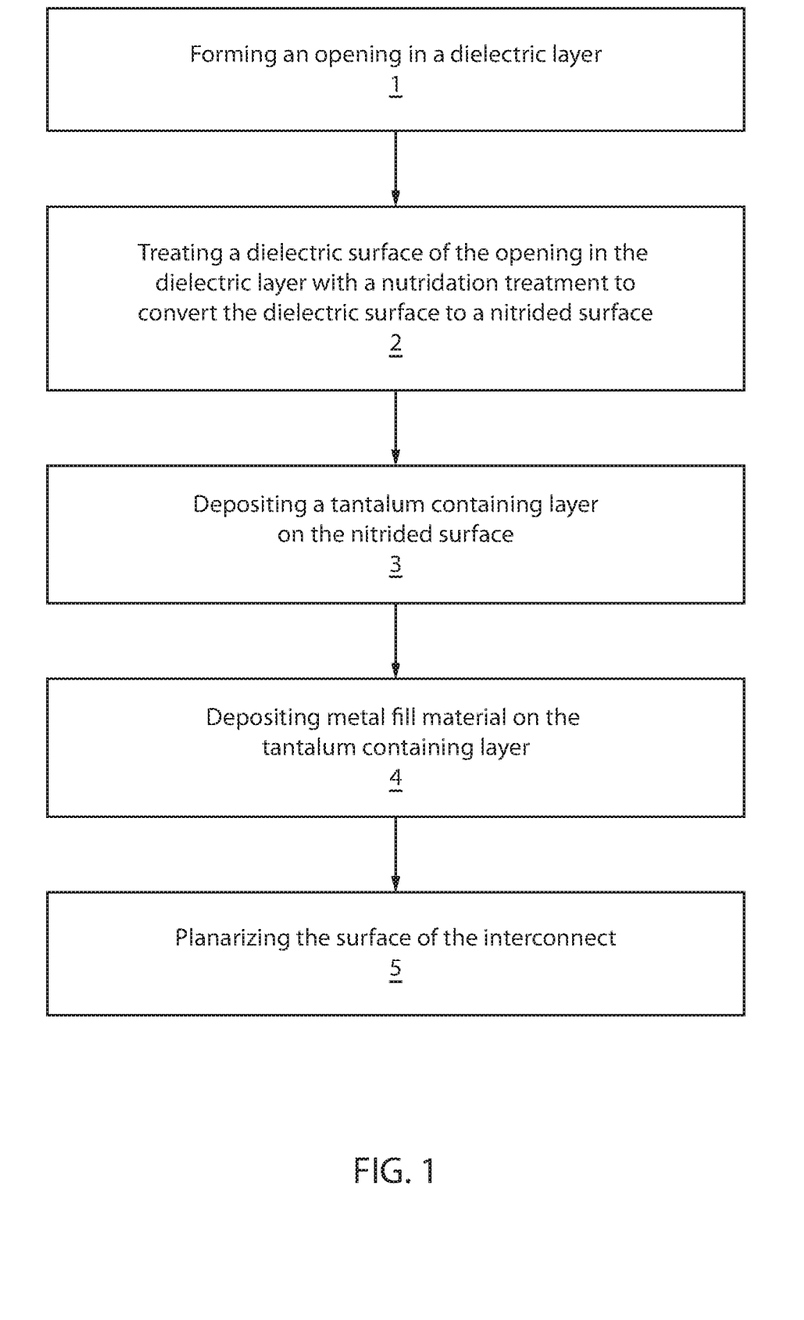
FIG. 1 is a flow chart illustrating one embodiment of a method for forming a copper interconnect in accordance with one embodiment of the methods and structures described herein.

FIG. 1 illustrates one embodiment of a method for forming a copper interconnect. The interconnects described herein can be to any component of an electrical device, such as a semiconductor device, e.g., field effect transistor (FET), fin type field effect transistor (FinFET), metal oxide semiconductor field effect transistor (MOSFET), bipolar junction transistor, vertical finFET (V-FinFET); memory device, e.g., dynamic random access memory (DRAM), embedded dynamic random access memory (eDRAM), flash memory; and/or passive electronic devices, such as resistors and capacitors.

Figure 2:
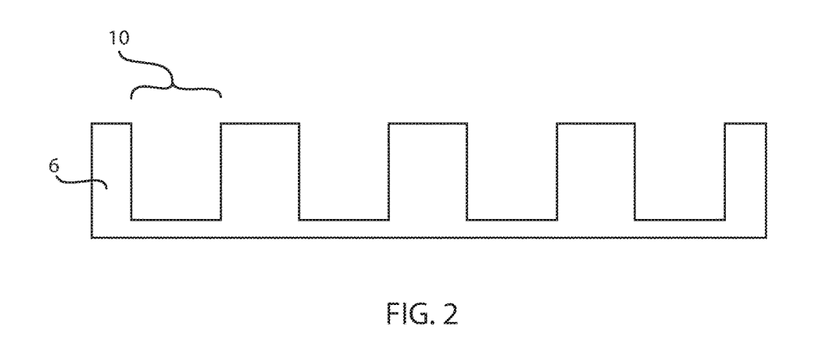
FIG. 2 is a side cross-sectional view depicting one embodiment of a dielectric layer being patterned for forming an interconnect.

The method may begin at step 1 of the process flow described in FIG. 1 with forming an opening 10 in a dielectric layer 6, as depicted in FIG. 2. In some embodiments, the dielectric layer 6 may be an oxide, nitride or oxynitride material. In other embodiments, the dielectric layer 6 may be an organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ) and methylsilsesquioxane (MSQ), or combinations thereof.

In some embodiments, the dielectric layer 6 may be a low-k dielectric layer. The term "low-k" as used herein denotes that the dielectric constant of the dielectric layer 6 is less than the dielectric constant of silicon oxide ($SiO_2$) at room temperature (e.g., 20° C. to 25° C.). For example, a dielectric layer 6 composed of a low-k dielectric material typically have a dielectric constant that is less than 4.0, e.g., 3.9. In one embodiment, the low-k dielectric layer 6 have a dielectric constant ranging from 1.75 to 3.5. In another embodiment, the dielectric layer 6 can be composed of a low-k dielectric having a dielectric constant ranging from 2.0 to 3.2. In yet an even further embodiment, the dielectric layer 6 of the low-k dielectric material can have a dielectric constant ranging from 2.25 to 3.0.

In some embodiments, the low-k dielectric material that provides the dielectric layer 6 may be carbon-doped silicon dioxide, in which by doping SiO2 with carbon, one can lower the dielectric constant to 3.0. In some other embodiments, the low-k dielectric material that provides the dielectric layer 6 may be a spin-on organic polymeric dielectric. Polymeric dielectrics can be deposited by a spin-on approach, such as those traditionally used to deposit photoresist, rather than chemical vapor deposition. Integration difficulties include low mechanical strength and thermal stability. Some examples of spin-on organic low-κ polymers are polyimide, polynorbornenes, benzocyclobutene, and PTFE. Spin on silicon based polymeric dielectrics may include hydrogen silsesquioxane (HSQ) and methylsilsesquioxane (MSQ). It is noted that the above examples of dielectric materials for the dielectric layer 10 have been provided for illustrative purposes only, and are not intended to limit the present disclosure. It is noted that any dielectric may be employed, but in some examples it can be preferred that the dielectric layer 10 is a silicon and carbon containing dielectric.

The dielectric layer 6 may be formed using chemical vapor deposition (CVD), such as atmospheric pressure CVD (APCVD), low pressure CVD (LPCVD) and plasma enhanced CVD (PECVD), metal-organic CVD (MOCVD) and combinations thereof may also be employed. In some other embodiments, the dielectric layer 6 may be deposited using spin on deposition or deposition from solution.

The openings 10 may be formed in the dielectric layer 6 using photolithography and etch method steps. For example, a pattern is produced by applying a photoresist to the surface to be etched; exposing the photoresist to a pattern of radiation; and then developing the pattern into the photoresist utilizing conventional resist developer. Once the patterning of the photoresist is completed, the sections of the dielectric layer covered by the photoresist are protected while the exposed regions are removed using a selective etching process that removes the unprotected regions.

The etch process for forming the opening 10 may be an anisotropic etch, such as reactive ion etch (RIE), laser etching, and/or plasma etching. In other embodiments, the etch process for forming the openings 10 may be an isotropic etch, such as a wet chemical etch. Although the openings 10 that are depicted in FIG. 2 having a trench type geometry that does not extend through an entirety of the depth of the dielectric layer 6, other embodiments have also been contemplated for the geometry of the openings 10. For example, the openings 10 can also extend through an entirety of the depth of the dielectric layer 6 having a via opening like geometry.

Figure 3:
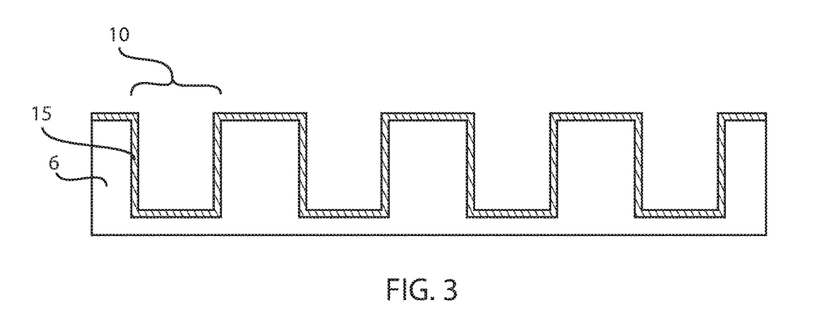
FIG. 3 is a side cross-sectional view depicting one embodiment of treating the patterned dielectric layer with an nitridation process.

Step 2 of the process flow illustrated in FIG. 1 may include treating a dielectric surface of the opening 10 in the dielectric layer 6 with a nitridation treatment to convert the dielectric surface to a nitrided surface 15. The dielectric surface that is nitrided, i.e., nitrided surface 15, may include the sidewall surfaces and base surfaces of the opening 10, as depicted in FIG. 3. The depth of the nitrided surface 15 may be conformal for both the sidewalls and base, but other embodiments may include that the depth of the nitrided surface 15 is greater at the base of the opening 10 than on the sidewalls of the opening 10. The term "nitrided surface" denotes that the nitrogen content of the dielectric surface is 0.5 at. % or greater. In some embodiments, the nitrogen content of the nitrided surface may range from 0.5 at. % to 80 at. %. In another embodiment, the nitrogen content of the nitrided surface may range from 2 at. % to 20 at. %.

In some embodiments, the nitridation treatment comprises a neutral atom beam nitridation. In one example, neutral atom beam nitridation includes the steps of pressurizing a nitrogen containing gas, and expanding the nitrogen containing gas through a nozzle into a vacuum to create a beam of nitrogen gas clusters, wherein each cluster is comprised weakly bound atoms. Thereafter, the neutral atom beam nitridation method further includes charging the nitrogen gas clusters to accelerate the nitrogen gas clusters, and dissociating the nitrogen gas clusters. In a following step, after dissociating the nitrogen gas clusters, the beam is deflected to remove the charge and provide a neutral atom beam.

In some embodiments, the neutral atom beam nitridation step may begin with a beam of accelerated gas cluster ions that can be initially produced using methods that are similar to gas cluster ion beam (GCIB), but the in neutral atom beam treatments the gas cluster is caused to dissociate and a deflector removes the charge. In some embodiments, a pressurized nitrogen containing gas is expanded through a small nozzle into vacuum to form a beam of gas clusters. In some embodiments, the nitrogen containing gas is selected from the group consisting of ammonia ($NH_3$), nitrogen ($N_2$), Diazene ($N_2H_2$) and combinations thereof.

In some embodiments, the pressurized nitrogen containing gas is at a pressure ranging from 5 atmospheres to 15 atmospheres. In one example, the pressurized nitrogen containing gas is at a pressure that is equal to 10 atmospheres. As explained above to provide the beam of gas clusters, the pressurized nitrogen containing gas may be passed through a nozzle into a vacuum chamber. The vacuum can range from $1\times10^{-4}$ atmospheres to $1\times10^{-6}$ atmospheres. In one example, the vacuum is equal to $1\times10^{-5}$ atmospheres.

Each cluster in the beam of gas clusters can be comprised of several hundred to a few thousand weakly bound atoms. The clusters are caused to become electrically charged and they are then accelerated by high potentials of up to several tens of thousands of volts. The accelerated clusters have very high total energies, but because the energy is carried collectively by a large number of constituent atoms, individual atoms of the clusters have only relatively low energies.

Dissociation is a process in which the clusters in which molecules within the clusters are caused to separate or split into smaller particles. An electrostatic deflector can then be used to eliminate all residual charged species from the beam. In some embodiments, following deflecting the beam of the nitrogen gas clusters to provide the neutral atom beam, the particles are electrically neutral and at an energy ranging from 10 eV to 100 eV.

Upon target impact, the accelerated neutral atom beams produce surface modification to a depth of less than 5 nm. In some embodiments, the nitrogen from the neutral atom beam penetrates a dielectric surface by a dimension less than 5 nm. In one example, the nitrogen introduced by the accelerated neutral atom beam penetrates the dielectric surface by a dimension of 3 nm or less. In other examples, the maximum depth that the nitrogen extends to in the dielectric surface may be as great as 1 nm, 2 nm, 3 nm, 4 nm or 5 nm, as well as any range of depths using one of the aforementioned values as a lower endpoint of the range and one of the aforementioned values as a higher endpoint of the range, e.g., a range extending from 1 nm to 3 nm.

In some embodiments, when the dielectric layer 6 is composed of at least silicon and carbon, the neutral atom beam causes a carbon depletion in the dielectric layer 6, wherein the nitrogen bonds to the damaged bonding in the dielectric that occurs from the carbon depletion. In some embodiments, the nitrided surface 15 may be composed of silicon, carbon and nitrogen, as well as oxygen and nitrogen and other elements typically found in dielectric materials. For example, when the dielectric layer is a silicon and carbon containing oxide, in one embodiment the nitrided surface 15 may be composed of 2 at. % to 20 at. % nitrogen (N), 5 at. % to 40 at. % carbon (C), 10 at. % to 40 at. % oxygen (O), 10 at. % to 40 at. % silicon (Si), and combinations thereof.

In some examples, the nitrogen content in the nitrided surface may be graded, in which the higher concentration of nitrogen is present at the surface of nitrided surface 15 of the dielectric layer 6 and the lower concentration of nitrogen is present at a depth within the dielectric layer 6, the concentration typically gradually decreasing for the highest concentration to the lowest concentration of nitrogen.

Figure 4A:
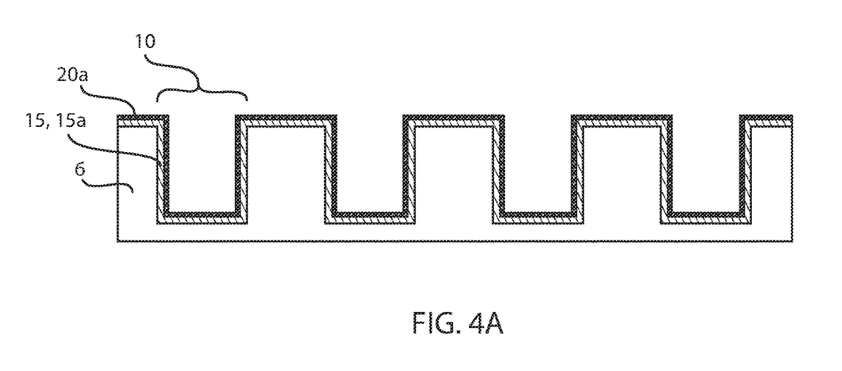
FIG. 4A is a side cross-sectional view depicting one embodiment of depositing a tantalum containing layer on the nitrided surface of the patterned dielectric layer, in which a portion of the tantalum containing layer intermixes with the nitrided surface to provide a tantalum and nitrogen alloy layer, and a portion of the tantalum containing layer does include nitrogen.
Figure 4B:
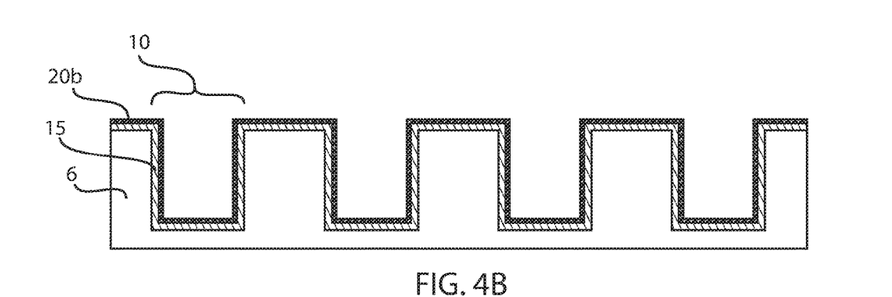
FIG. 4B is a side cross-sectional view depicting one embodiment of depositing a tantalum containing layer on the nitrided surface of the patterned dielectric layer, in which an substantial entirety of the tantalum containing layer intermixes with the nitrided surface to provide a tantalum and nitrogen alloy layer.

Step 3 of the method described in FIG. 1 includes depositing a tantalum containing layer 20a, 20b on the nitrided surface 15, as illustrated in FIGS. 4A and 4B. In some embodiments, the tantalum containing layer 20a, 20b is deposited at a composition that is composed of greater than 90 at. % tantalum. In other embodiments, the tantalum containing layer 20a, 20b is deposited as a composition that is composed of greater than 95 at. % tantalum. In yet other embodiments, the tantalum containing layer 20a, 20b is deposited at a composition that is greater than 99 at. % tantalum, e.g., 100 at. % tantalum.

In one example, the tantalum containing layer 20a, 20b can be deposited using atomic layer deposition (ALD). "Atomic layer deposition" (ALD) as used herein refers to a vapor deposition process in which numerous consecutive deposition cycles are conducted in a deposition chamber. Typically, during each cycle a metal precursor is chemisorbed to the deposition surface; excess precursor is purged out; a subsequent precursor and/or reaction gas is introduced to react with the chemisorbed layer; and excess reaction gas (if used) and by-products are removed. "Chemisorption" and "chemisorbed" as used herein refer to the chemical adsorption of vaporized reactive precursor compounds on the deposition surface. In some examples, the adsorbed species are bound to the deposition surface as a result of relatively strong binding forces characterized by high adsorption energies (>30 kcal/mol), comparable in strength to ordinary chemical bonds. The chemisorbed species can limited to the formation of a monolayer on the deposition surface. In atomic layer deposition, one or more appropriate reactive precursor compounds are alternately introduced (e.g., pulsed) into a deposition chamber and chemisorbed onto the deposition surface. Each sequential introduction of a reactive precursor compound is typically separated by an inert carrier gas purge. Each precursor compound co-reaction adds a new atomic layer to previously deposited layers to form a cumulative solid layer. It should be understood, however, that atomic layer deposition can use one precursor compound and one reaction gas. Atomic layer deposition (ALD) is similar in chemistry to chemical vapor deposition, except that the atomic layer deposition reaction breaks the chemical vapor deposition reaction into two half-reactions, keeping the precursor materials separate during the reaction.

In some embodiments, pentakis(dimethylamino)tantalum (PDMAT) can be used as a tantalum source for atomic layer deposition (ALD) of the tantalum containing layer 20. In some other embodiments, the tantalum source may be a precursor composed of TBTDMT (Ta(=NtBu)(NMe$_2$)$_3$). In other embodiments, the tantalum (Ta) source may be composed of Tris(diethylamido)(tert-butylimido) tantalum and hydrazine. The tantalum (Ta) source may also TaCl$_5$. In some embodiments, the tantalum (Ta) source may also be provided by pentakis(dimethylamino)tantalum (PDMAT), pentakis(ethylmethylamino) tantalum (PEDMAT), (tert-butylimido)tris(ethylmethylamino)tantalum (TBTMET), (tert-butylimido)tris(diethylamido)tantalum (TBTDET) and combinations thereof.

The tantalum containing layer 20a, 20b may be deposited on the nitridized dielectric surface 15 that is present on the sidewall and base surfaces of the of the opening 10, as depicted in FIG. 4. The tantalum containing layer 20a, 20b may be deposited to a thickness of 500 Å or less. In some embodiments, the tantalum containing layer 20a, 20b may be deposited to a thickness ranging from 5 Å to 200 Å. In some other embodiments, the tantalum containing layer 20a, 20b can be deposited to a thickness ranging from 10 Å to 100 Å. The tantalum containing layer 20a, 20b may be deposited as a conformal layer. The term "conformal" denotes a layer having a thickness that does not deviate from greater than or less than 30% of an average value for the thickness of the layer.

Figure 6A:
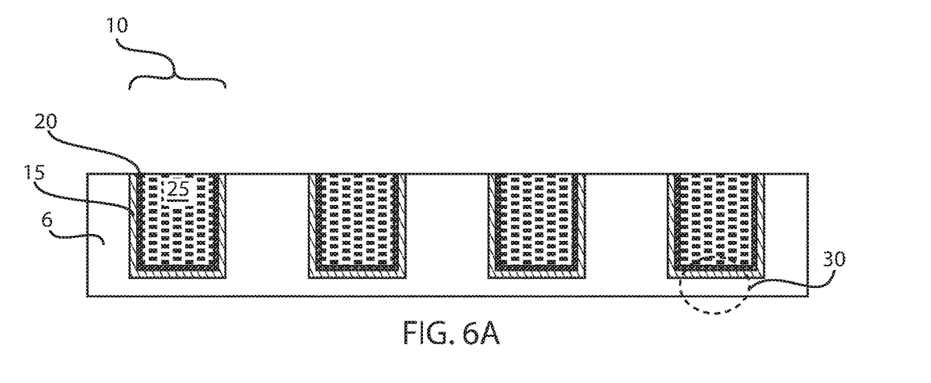
FIG. 6A is a side cross-sectional view depicting one embodiment of planarizing the structure depicted in FIG. 5A.
Figure 7:
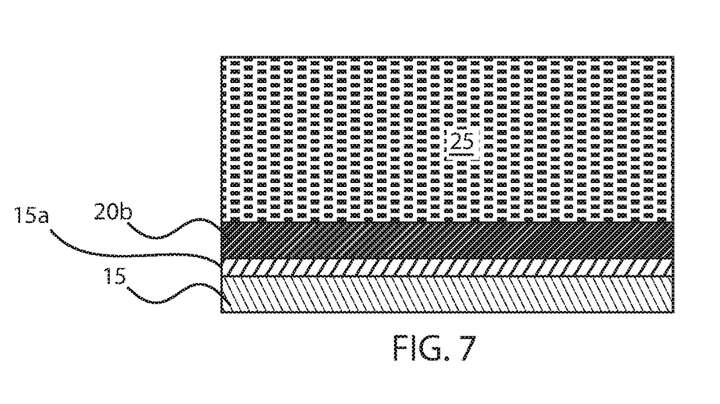
FIG. 7 is a side cross-sectional view of one embodiment of a material stack including a nitridized dielectric surface, tantalum nitride alloy layer, and tantalum metal layer that provides an interconnect in accordance with the methods described herein.

In some embodiments, there is a region of intermixing between tantalum (Ta) from the tantalum containing layer 20a and nitrogen (N) from the nitrided surface 15, i.e., a formed tantalum-nitrogen (Ta—N) alloy layer 15a on the nitrided dielectric surface, in a portion of the tantalum containing layer 20 that is deposited on the nitrided dielectric surface 15 remains substantially nitrogen free, as depicted in FIG. 7. Although FIG. 7 illustrates a magnified view of the interfaces between the later formed metal fill 25, the tantalum containing layer 20a, the tantalum-nitrogen alloy layer 15a, and the dielectric surface 15 at region 300 of the finalized structure depicted in FIG. 6, the intermixing that provides the tantalum-nitrogen alloy layer 15a may occur at this stage of the process flow.

In some embodiments, the tantalum-nitrogen (Ta—N) alloy region 15a can be composed of 95.5 at. % to 20 at. % tantalum (Ta) and 0.5 at. % to 80 at. % nitrogen (N). In other embodiments, the tantalum-nitrogen (Ta—N) alloy region 15a can be composed of 98 at. % to 80 at. % tantalum (Ta) and 2 at. % to 20 at. % nitrogen (N). The tantalum-nitrogen (Ta—N) alloy layer 15a, may be a continuous layer, i.e., without any breaks or discontinuations in the continuity of the layer, that is present at the interface of the nitrided surface 15 of the dielectric layer 6 and the remaining portion of the tantalum containing layer 20a that does not contain a substantial amount of nitrogen (N). The tantalum-nitrogen (Ta—N) alloy layer 15a can have a thickness ranging from 1 Å to 20 Å. In some examples, the tantalum-nitrogen (Ta—N) alloy layer 15a can have a thickness ranging from 2 Å to 10 Å. In other examples, the thickness of the tantalum-nitrogen (Ta—N) alloy layer 15a may be equal to 1 Å, 2 Å, 3 Å, 4 Å, 5 Å, 6 Å, 7 Å, 8 Å, 9 Å, 10 Å, and 15 Å, as well as any range of depths using one of the aforementioned values as a lower endpoint of the range and one of the aforementioned values as a higher endpoint of the range.

In the embodiment consistent with FIGS. 1, 4A and 7, a portion of the tantalum containing layer 20a remains that is substantially free of nitrogen (N). The tantalum containing layer 20a that is substantially free of nitrogen (N) is in direct contact with the tantalum-nitrogen (Ta—N) alloy layer 15a, and contains a maximum nitrogen (N) content that is equal to 0.4 at. % or less. In other embodiments, being substantially free of nitrogen (N) may be consistent with a nitrogen content in the tantalum containing layer 20a that is equal to 0.3 at. % or less. In yet other embodiments, the being substantially free of nitrogen (N) may be consistent with a tantalum containing layer 20a that is entirely free of nitrogen (N). The thickness of the tantalum containing layer 20a that is substantially free of nitrogen (N) may range from 1 Å to 400 Å. In some examples, the tantalum containing layer 20a that is substantially free of nitrogen (N) can have a thickness ranging from 2 Å to 10 Å. In other examples, the thickness of the tantalum containing layer 20a that is substantially free of nitrogen (N) may be equal to 1 Å, 2 Å, 3 Å, 4 Å, 5 Å, 6 Å, 7 Å, 8 Å, 9 Å, or 10 Å, as well as any range of depths using one of the aforementioned values as a lower endpoint of the range and one of the aforementioned values as a higher endpoint of the range.

Figure 8:
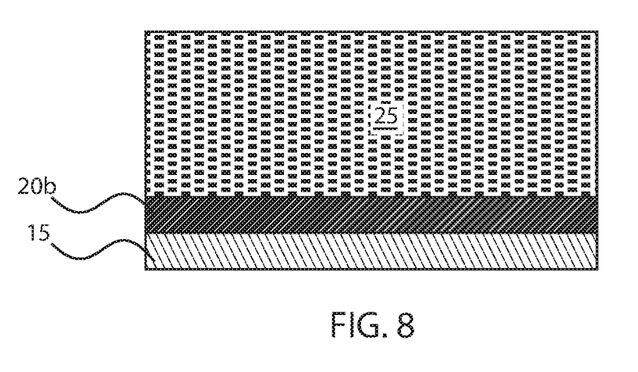
FIG. 8 is a side cross-sectional view of another embodiment of a material stack including a nitridized dielectric surface tantalum nitride alloy layer and metal fill that that provides an interconnect in accordance with another embodiment of the methods described herein.

In another embodiment, the as deposited tantalum containing layer 20b is entirely converted into a tantalum and nitrogen alloy layer, as depicted in FIGS. 4B and 8. In this example, there is no tantalum containing layer that is substantially free of nitrogen. The tantalum and nitrogen alloy layer 20b may be composed of 95.5 at. % to 20 at. % tantalum (Ta) and 0.5 at. % to 80 at. % nitrogen (N). In other embodiments, the tantalum-nitrogen (Ta—N) alloy region 20b can be composed of 98 at. % to 80 at. % tantalum (Ta) and 2 at. % to 20 at. % nitrogen (N). The thickness of the tantalum and nitrogen alloy layer 20b may be equal to the as deposited thickness of the tantalum containing layer 20.

Figure 5A:
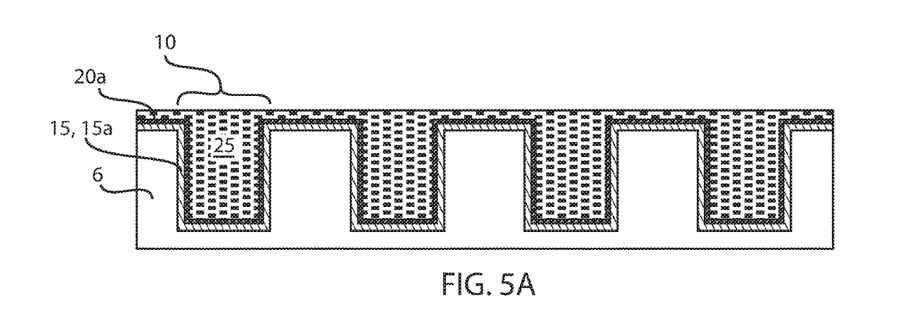
FIG. 5A is a side cross-sectional view depicting one embodiment of depositing a metal fill material on the tantalum containing layer that is depicted in FIG. 4A.
Figure 5B:
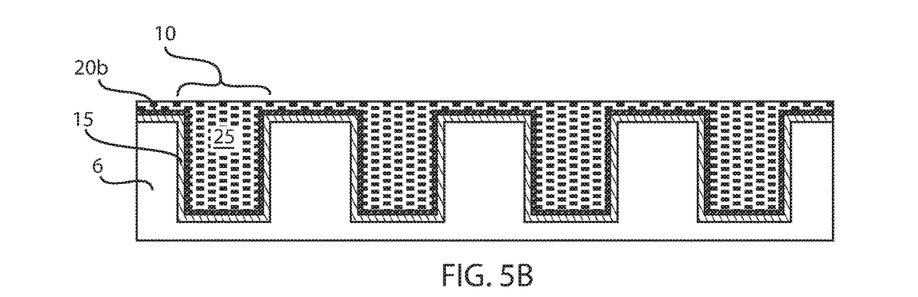
FIG. 5B is a side cross-sectional view depicting one embodiment of depositing a metal fill material on the tantalum and nitrogen alloy layer that is depicted in FIG. 4B.

The method may continue with step 4 of the process flow illustrated in FIG. 1, in which a metal fill material 25 is deposited on the tantalum containing layer 20a, 20b, i.e., is deposited on the tantalum and nitrogen alloy layer 20b, as depicted in FIGS. 5B and 8, or is deposited on the tantalum containing layer 20a remains that is substantially free of nitrogen (N), as depicted in FIGS. 5A and 7. The metal fill 25 comprises a metal selected from the group consisting of copper (Cu), tungsten (W), silver (Ag), gold (Au), platinum (Pt), aluminum (Al), titanium (Ti), Cobalt (Co) and combinations thereof. In one example, the metal fill 25 is copper.

The metal fill 25 may be deposited to fill the remained of the openings 10 in the dielectric layer 6. The metal fill 25 may be deposited to fill the entirety of the opening 10 and to extend from the openings 10 overlying the upper surfaces of the dielectric layer 6. The metal fill 25 may be deposited using atomic layer deposition (ALD), chemical vapor deposition (CVD) and/or physical vapor deposition (PVD). Examples of CVD suitable for depositing the metal fill 25 include plasma enhanced chemical vapor deposition (PECVD) or metal organic chemical vapor deposition (MOCVD). Examples of PVD suitable for depositing the metal fill 25 may include plating, electroplating, electroless plating, sputtering and combinations thereof.

Figure 6B:
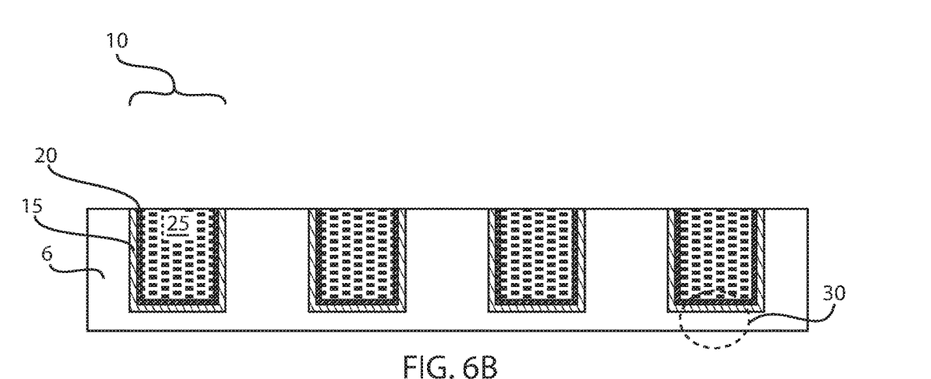
FIG. 6B is a side cross-sectional view depicting one embodiment of planarizing the structure depicted in FIG. 5B.

The method may continue with step 5 of the process flow illustrated in FIG. 1, in which the structure depicted in FIGS. 5A and 5B is planarized. FIG. 6A depicts one embodiment of planarizing the structure depicted in FIG. 5A. FIG. 6B depicts one embodiment of planarizing the structure depicted in FIG. 5B. In some embodiments, the structures depicted in FIGS. 6A and 6B may be planarized, e.g., planarized using chemical mechanical planarization (CMP).

FIGS. 6A-8 illustrate one embodiment of an interconnect that is formed using the above described methods. The interconnect typically includes an opening through a dielectric layer 6 including silicon (Si) and carbon (C), in which a nitrided dielectric surface 15 is present on the opening sidewalls and base. Referring to FIG. 7, in some embodiments, a tantalum and nitrogen alloy layer 15a is present on an interface that is present on the nitrided dielectric surface 15, in which the tantalum and nitrogen alloy layer 15a is positioned between the nitrided dielectric surface 15 and a tantalum layer 20a that is substantially free of nitrogen (N). Still referring to FIG. 7, a metal fill 25 may fill the remainder of the opening 10. The metal fill 25 may be composed of a metal selected from the group consisting of copper (Cu), tungsten (W), silver (Ag), gold (Au), platinum (Pt), aluminum (Al), titanium (Ti) Iridium (Jr), Ruthenium (Ru), Rhodium (Rh), Nickel (Ni), Cobalt (Co) and combinations thereof.

The embodiment depicted in FIG. 8 is similar to the embodiment that is depicted in FIG. 7 with the exception of that tantalum layer 20a being substantially free of nitrogen that is depicted in FIG. 7 is eliminated. In the embodiment depicted in FIG. 8, the tantalum and nitrogen alloy layer 20b has a first surface that is present in direct contact with the nitrided dielectric surface 15, and the metal fill 25 is in direct contact with the opposite second surface of the tantalum and nitrogen alloy layer 20b.

In each of the embodiments depicted in FIGS. 6A-8, the nitrided dielectric surface 15 has a thickness of 5 nm or less, e.g., 3 nm or less. The limited depth of the nitrided dielectric surface 15 is sometimes resultant upon the neutral atom beam method of formation that is described above. The dielectric layer adjacent to the nitrided dielectric surface 15 is completely free of bond damage and the chemical composition is the same as the bulk material.

The interconnect structure depicted in FIGS. 6A-8, when including a nitrided dielectric surface 15 formed on a silicon, carbon, and oxygen containing low-k dielectric, and a material stack that includes at least one of the tantalum and nitrogen containing layers 15, 15a, and the tantalum containing layers 20a, 20b may have an adhesion to the dielectric 6 that is greater than 3 J/m$^2$.

Having described preferred embodiments of antifuse structures and methods of forming antifuse structures (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming an interconnect comprising:
   forming an opening in a dielectric layer;
   treating a dielectric surface of the opening in the dielectric layer with a nitridation treatment to convert the dielectric surface to a nitrided surface, wherein the nitridation treatment comprises a neutral atom beam nitridation;
   depositing a tantalum containing layer on the nitrided surface; and
   depositing metal fill material on the tantalum containing layer.

2. The method of claim 1, wherein the opening in the dielectric layer is formed by photolithography and etching, the opening having sidewall surfaces and a base surface provided by the dielectric layer.

3. The method of claim 1, wherein the dielectric layer is a silicon and carbon containing dielectric.

4. The method of claim 1, wherein the neutral atom beam nitridation comprises;
   pressurizing a nitrogen containing gas;
   expanding the nitrogen containing gas through a nozzle into a vacuum to create a beam of nitrogen gas clusters, wherein each cluster is comprised weakly bound atoms;
   charging the nitrogen gas clusters to accelerate the nitrogen gas clusters;
   dissociating the nitrogen gas clusters; and
   deflecting a beam of the nitrogen gas clusters following said dissociating to provide a neutral atom beam.

5. The method of claim 4, wherein the nitrogen containing gas is selected from the group consisting of ammonia (NH$_3$), nitrogen (N$_2$), Diazene (N$_2$H$_2$) and combinations thereof.

6. The method of claim 4, wherein the pressurized nitrogen containing gas is at a pressure ranging from 5 atmospheres to 15 atmospheres.

7. The method of claim 6, wherein the expanding the nitrogen containing gas into said vacuum comprises a vacuum ranging from $1\times10^{-4}$ atmospheres to $1\times10^{-6}$ atmospheres.

8. The method of claim 7, wherein following said deflecting the beam of the nitrogen gas clusters to provide the neutral atom beam, the particles are electrically neutral and at an energy ranging from 10 eV to 100 eV.

9. The method of claim 1, wherein nitrogen from the neutral atom beam penetrates a dielectric surface by a dimension less than 5 nm.

10. The method of claim 1, wherein the neutral atom beam causes a carbon depletion in the dielectric, wherein the nitrogen bonds to the damaged bonding in the dielectric that occurs from the carbon depletion.

11. The method of claim 1, wherein depositing a tantalum containing layer on the nitrided surface a deposition process selected from the group consisting of sputtering, plating, electroplating, electroless plating and combinations thereof.

12. The method of claim 1, wherein metal fill comprises a metal selected from the group consisting of copper (Cu), tungsten (W), silver (Ag), gold (Au), platinum (Pt), aluminum (Al), titanium (Ti), Iridium (Jr), Ruthenium (Ru), Rhodium (Rh), Nickel (Ni), Cobalt (Co) and combinations thereof.

13. The method of claim 1, wherein the interconnect comprises a nitrided dielectric surface, a tantalum and nitrogen alloy layer that is present on the nitrided dielectric surface, a tantalum layer on the tantalum and nitrogen alloy layer surface, and a copper fill.

14. The method of claim 1, wherein the interconnect comprises a nitrided dielectric surface, a tantalum and nitrogen alloy layer that is present on the nitrided dielectric surface and a copper fill.

* * * * *